United States Patent [19]

Liu

[11] Patent Number: 5,864,465
[45] Date of Patent: Jan. 26, 1999

[54] DEVICE FOR COOLING CENTRAL PROCESSING UNITS

[76] Inventor: Michael Liu, P.O. Box 82-144, Taipei, Taiwan

[21] Appl. No.: 964,405

[22] Filed: Nov. 4, 1997

[51] Int. Cl.[6] ..................................................... H05K 7/20
[52] U.S. Cl. ........................................... 361/697; 174/16.3
[58] Field of Search ................................. 165/80.2, 80.3, 165/185, 121, 122, 126; 174/16.3; 361/694–697, 704, 707

[56] References Cited

U.S. PATENT DOCUMENTS

| | | | |
|---|---|---|---|
| 4,756,473 | 7/1988 | Takemae et al. | 361/697 |
| 5,101,321 | 3/1992 | Remise et al. | 361/695 |
| 5,457,342 | 10/1995 | Herbst, II | 361/697 |
| 5,734,554 | 3/1998 | Mitty et al. | 361/697 |

OTHER PUBLICATIONS

IBM Technical Disclosure Bulletin "Variable–Speed Cooling assembly for a Processor Chip" vol. 38, No. 08, pp. 613–614, Aug. 1995.

Primary Examiner—Gregory D. Thompson
Attorney, Agent, or Firm—A & J

[57] ABSTRACT

A device for cooling microprocessors includes a heat sink having a plurality of fins, a printed circuit board mounted on the heat sink, a fan mounted on the heat sink, a temperature sensor electrically connected to the printed circuit board, and a 12-pin ribbon cable connecting the printed circuit board to a main board, whereby when the temperature of the microprocessor picked up by the temperature sensor exceeds a predetermined value, the printed circuit board will send signals to the main board, loudspeaker and the first fan via the third, sixth and eleventh pins of the ribbon cable thereby informing the operator of the overheat of the microprocessor and therefore preventing the microprocessor from burning out.

5 Claims, 10 Drawing Sheets

DEVICE FOR COOLING CENTRAL PROCESSING UNITS

BACKGROUND OF THE INVENTION

1. Field of the Invention

This invention is related to a device for cooling central processing units and in particular to one which can effectively protect a central processing unit from overheating.

2. Description of the Prior Art

The fast development of information technologies enable computers to have enhanced effects and the central processing units are working faster than ever. The internal temperature of the computer also rises and may soon exceed the permitted working temperature. Therefore, in all personal computers, heat dissipation fans are mounted on the central processing unit for dissipating the heat inside the computer. However, such heat dissipation fans are only designed for cooling central processing units and cannot protect them from overheating.

Therefore, it is an object of the present invention to provide a device for cooling central processing units which can protect them from overheating.

SUMMARY OF THE INVENTION

This invention is related to an improved device for cooling central processing units.

It is the primary object of the present invention to provide a device for cooling central processing units which giving warning to the operator when the central processing unit is overheated.

It is another object of the present invention to provide a device for cooling central processing units which will send out a signal to turn off the power supplied to the main board, or to temporary stop the operation of the main board when the central processing unit is overheated.

It is still another object of the present invention to provide a device for cooling central processing units which will stop the operation of the fan when the temperature of the central processing unit is below a preset value.

It is still another object of the present invention to provide a device for cooling central processing units which can protect them from overheating.

It is a further object of the present invention to provide a device for cooling central processing units which is simple in construction and low in cost.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 1:
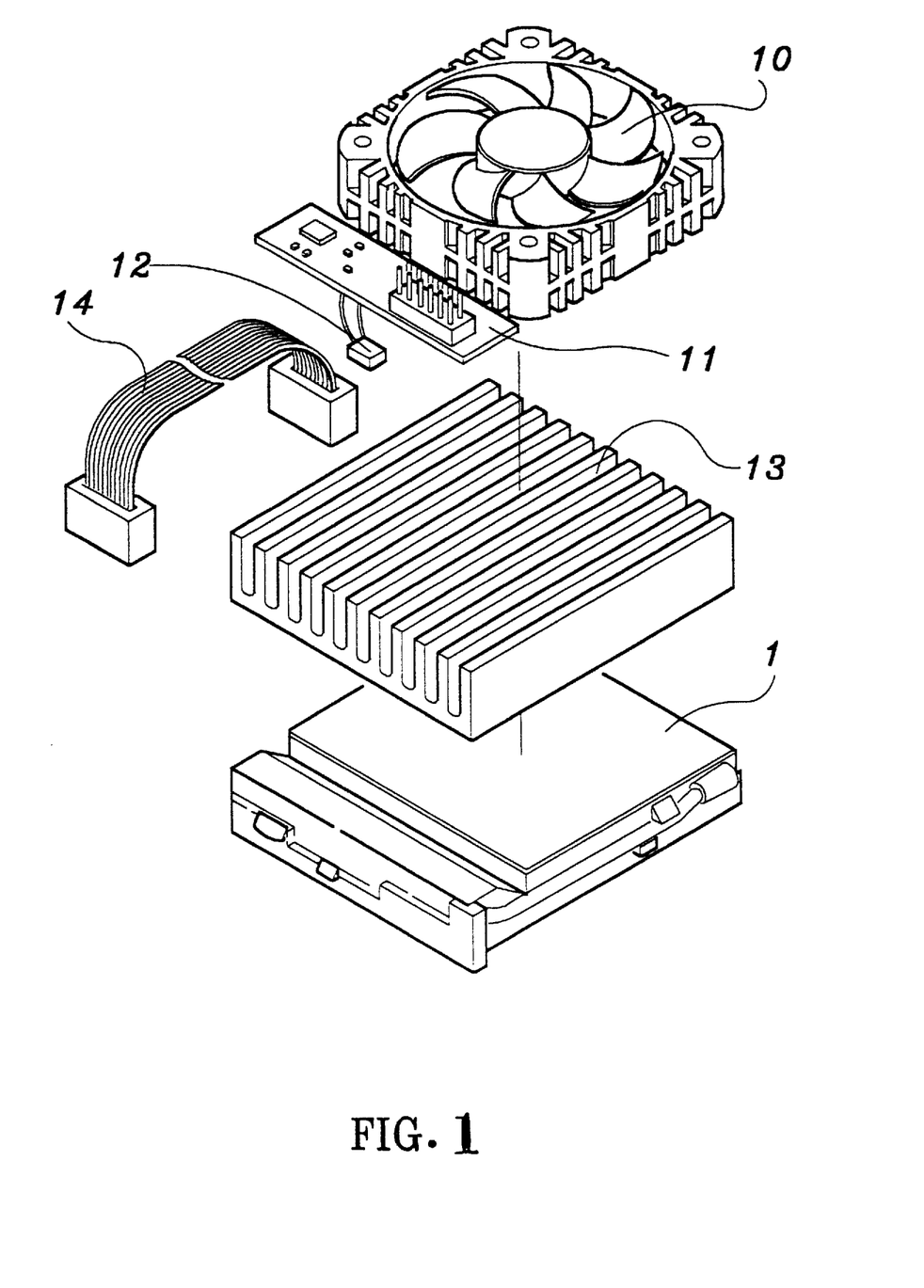
FIG. 1 is an exploded view of a device for cooling central processing units according to the present invention.
Figure 2:
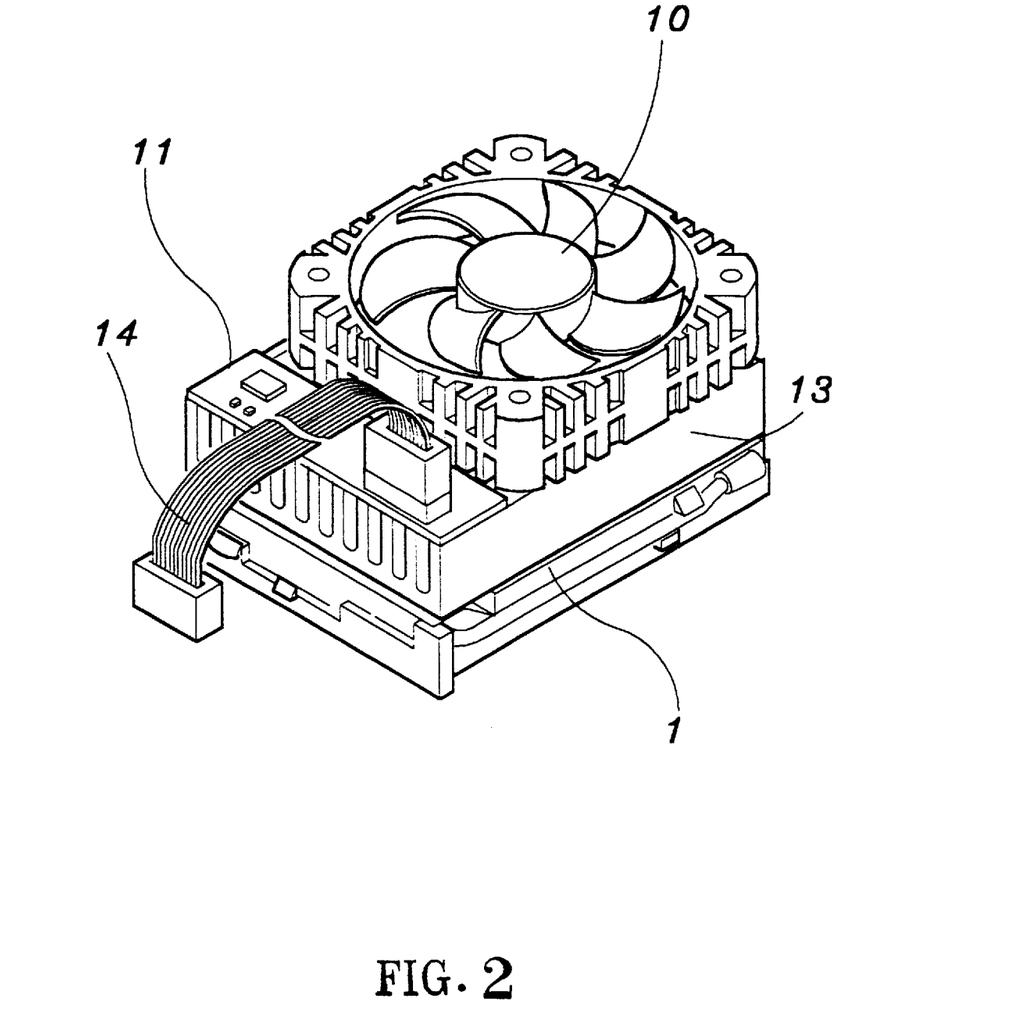
FIG. 2 is a perspective view of the device for cooling central processing units according to the present invention.
Figure 3:
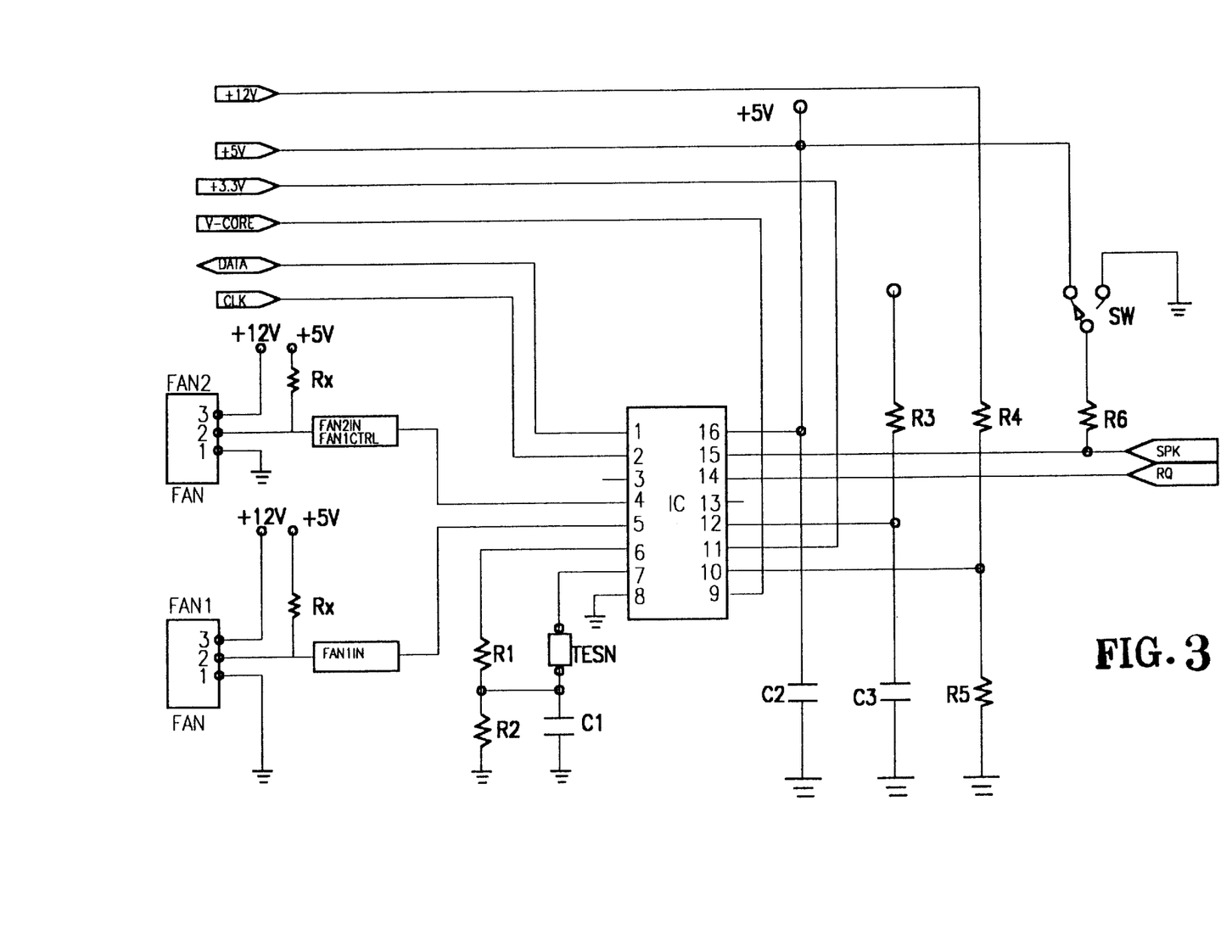
FIG. 3 is a circuit diagram of the present invention.
Figure 4:
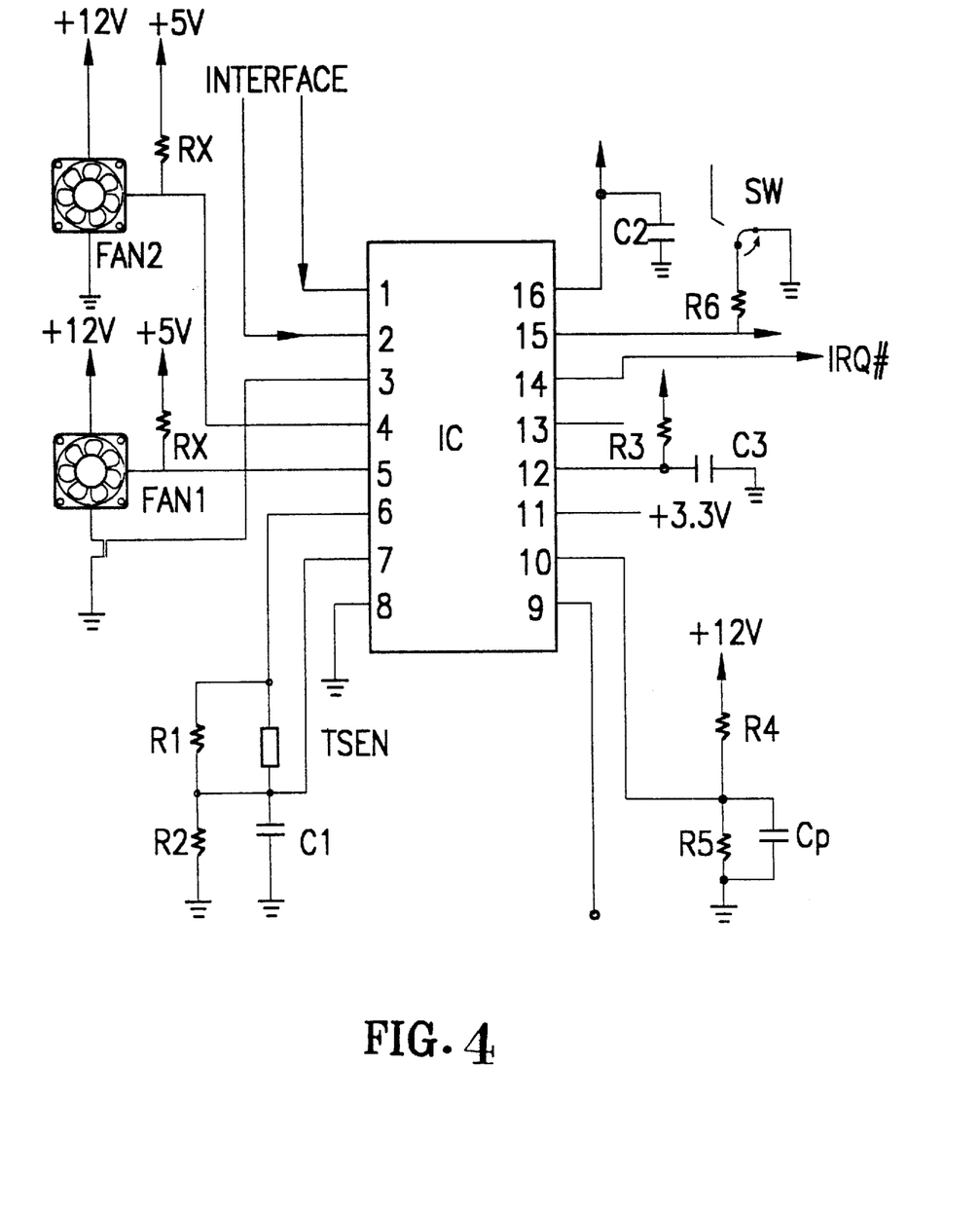
FIG. 4 is another circuit diagram of the present invention.
Figure 5:
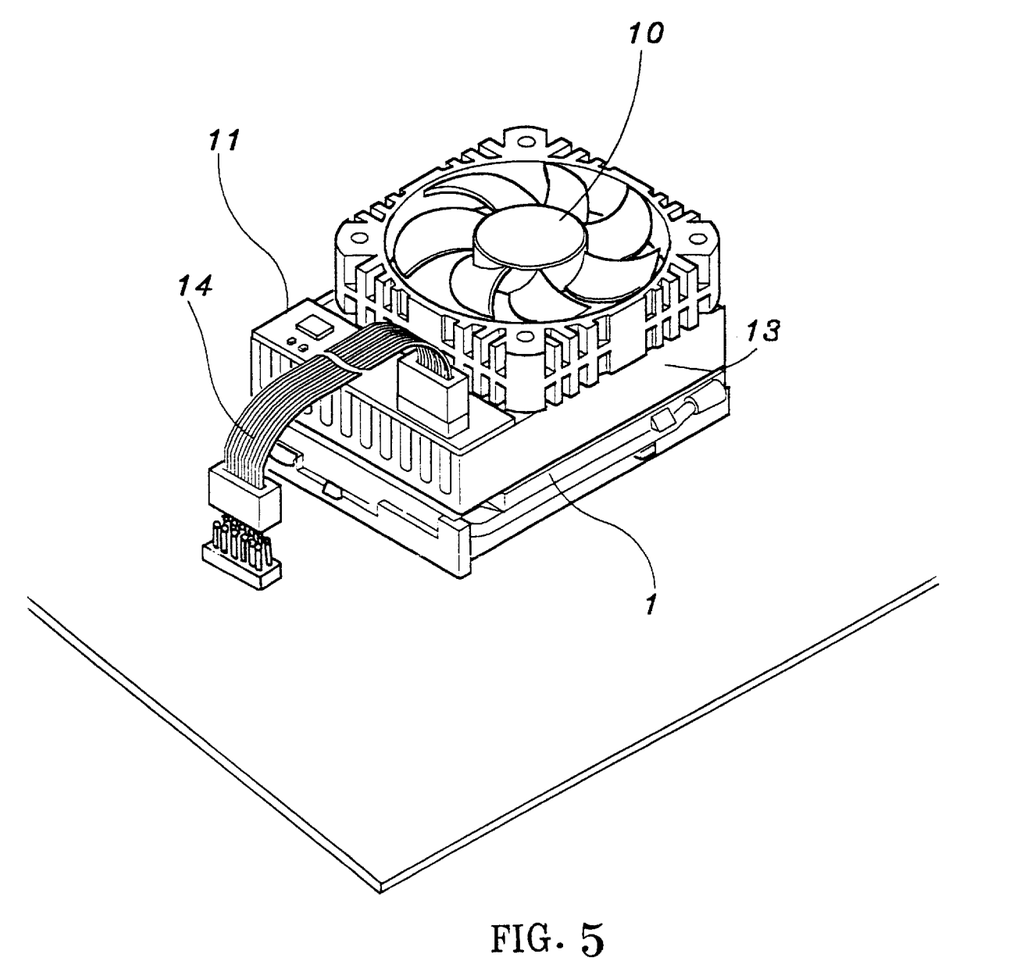
FIG. 5 illustrates how the printed circuit board is connected to the main board via the ribbon cable.

With reference to the drawings and in particular to FIGS. 1 and 2 thereof, the device for cooling central processing units according to the present invention essentially comprises a fan 10, a printed circuit board 11, a temperature sensor 12, and a heat sink 13. The heat sink 13 is a passive device that acts like a radiator to conduct heat away from the central processing unit. The heat sink 13 sits on the top of the central processing unit and has rises into spines between which air can pass. The bottom of the heat sink 13 is of a flat surface so that the heat sink 13 can be in close contact with the top of a central processing unit 1. The fan 10 is screwed or otherwise secured on the top of the heat sink 13. The temperature sensor 12 is fitted between two spines (shown but not numbered) of the heat sink 13. The printed circuit board 11 is mounted on the heat sink 13 and electrically connected to the temperature sensor 12 so that when the temperature picked up by the temperature sensor 12 exceeds the preset value, the circuit on the printed circuit board 11 will output a signal to cause a loudspeaker (see FIG. 3) to give warning to the user. The circuit may be of any conventional design well known to the art and is not considered a part of the invention. As shown in FIG. 2, the printed circuit board 11 is provided with an electrical socket (shown but not numbered) for connecting to the main board (not shown) of a computer (not shown) via a ribbon cable 14. As the temperature of the microprocessor 1 exceeds the preset value, the circuit on the printed circuit board 11 will also send a digital signal to the main board via the ribbon cable 14. The first and second pins of the ribbon cable 14 are used as the input interface between the operator and the printed circuit board. The third pin of the ribbon cable 14 is used for sending signal to inform the main board of the overheat of the microprocessor so that the main board will determine whether the computer will keep on working or not. The fourth pin of the ribbon cable 14 is not to be used. The fifth pin of the ribbon cable 14 is used as the input for a voltage of 5V. The sixth pin of the ribbon cable 14 is used for sending out signal to the loudspeaker to cause it to produce warning. The seventh pin of the ribbon cable 14 is connected to the ground. The eighth pin of the ribbon cable 14 is used for defining the reference voltage. The ninth pin of the ribbon cable 14 is used for inputting the speed of the fan 1. The tenth pin of the ribbon cable is used for the input of a voltage of 3.3V. The eleventh pin of the ribbon cable 14 is used for detecting the rotation of a second fan or inputting a digital signal for controlling the first fan 1 to rotate when the temperature of the microprocessor exceeds a preset value and to stop rotating when the temperature of the microprocessor is below the preset value. The twelve pin of the ribbon cable 14 is used for the input of a voltage of 12V. The eighth pin of the ribbon cable 14 may be used for determining the voltage supplied from the main board to the printed circuit board 11 to determine the working voltage for the printed circuit board 11 or for determining the working voltage as desired by the user. As shown in FIGS. 3 and 4, the temperature picked up by the temperature sensor TSEN is transmitted to the IC which will determine whether the temperature exceeds the value predetermined by the user or not. If the temperature exceeds the preset value, the fifteenth pin of the IC will output a signal to turn on a switch SW thereby connecting it to the power supply and therefore causing the loudspeaker to give warning.

Figure 6:
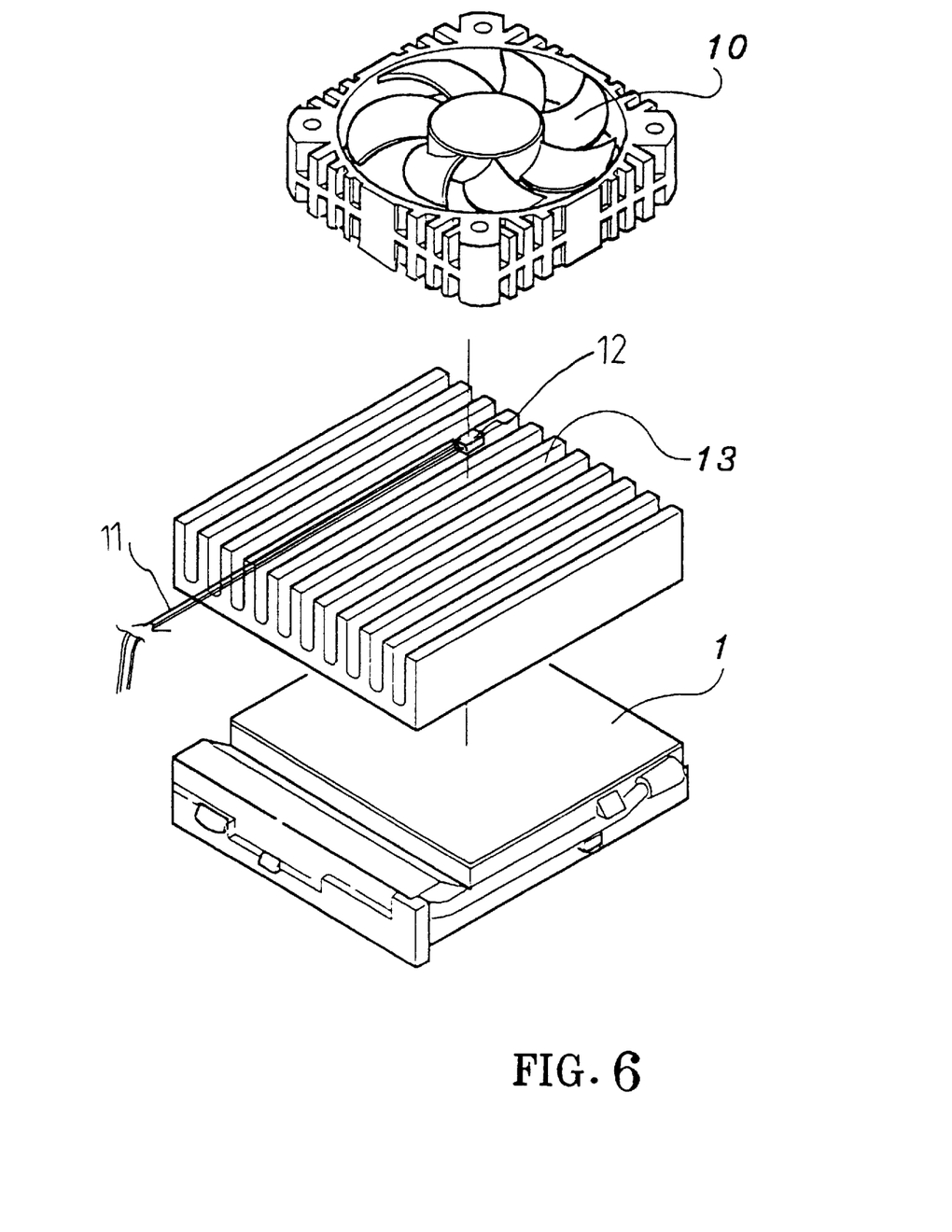
FIG. 6 is an exploded view of a second preferred embodiment according to the present invention.
Figure 7:
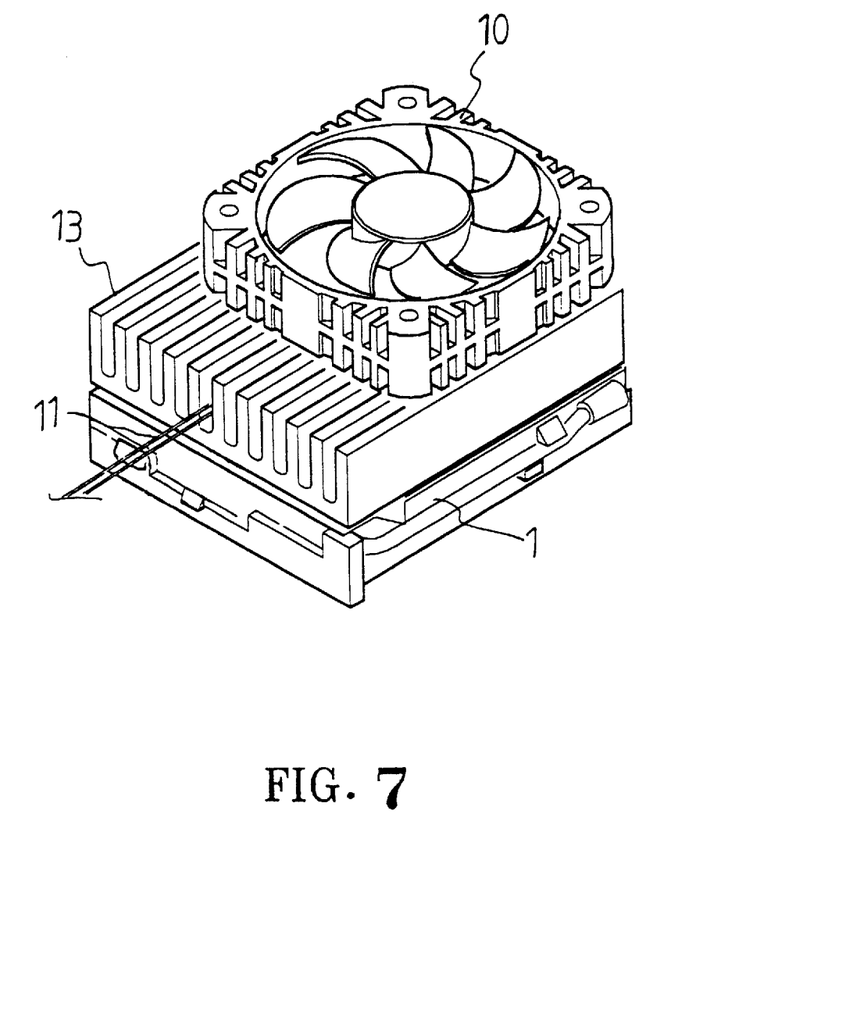
FIG. 7 is a perspective view of the second preferred embodiment.

FIGS. 6 and 7 illustrate a second preferred embodiment according to the present invention. As shown, the printed circuit board is omitted in this embodiment and the circuit is combined to the main board of a computer.

Figure 8:
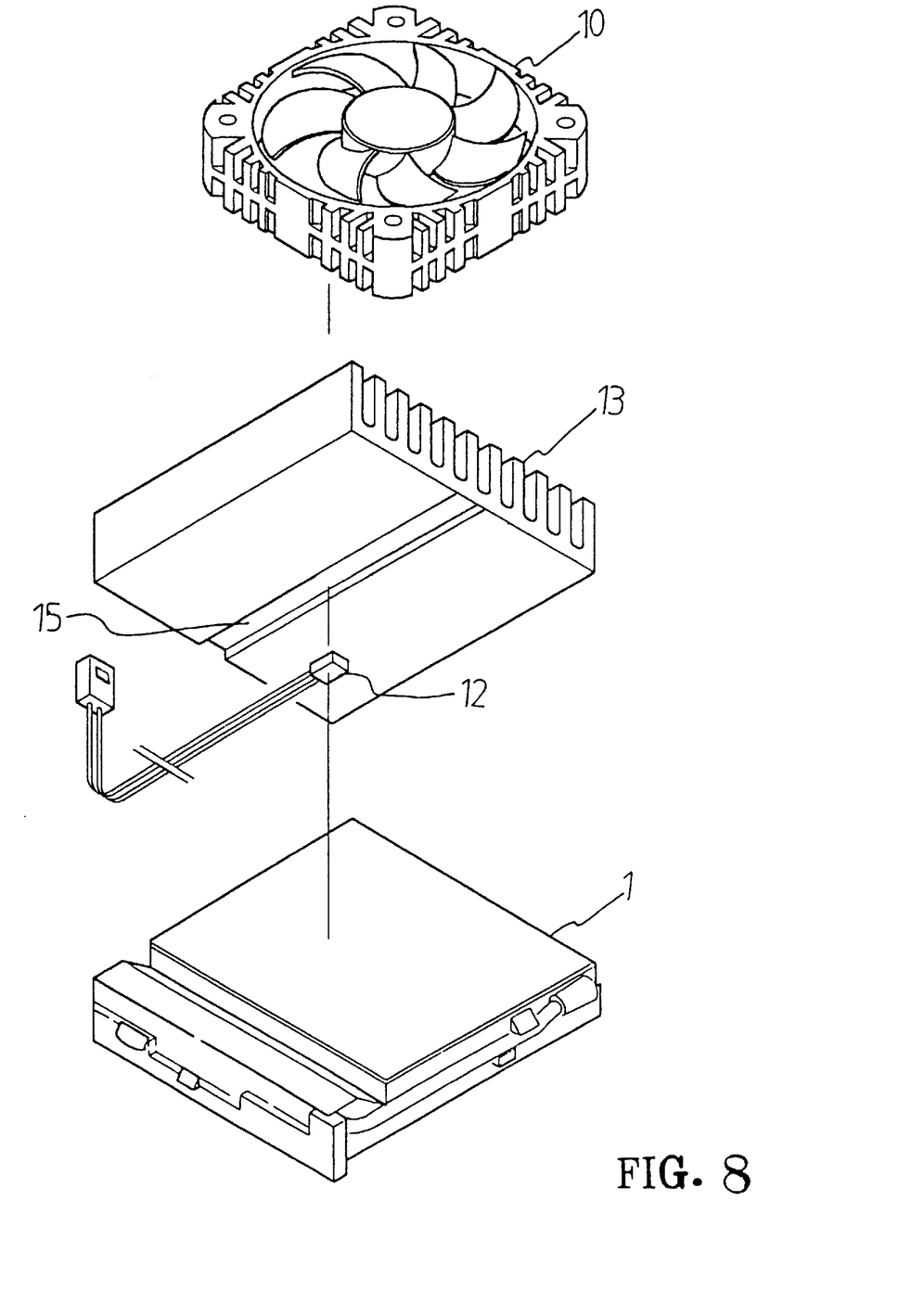
FIG. 8 is an exploded view of a third preferred embodiment according to the present invention.
Figure 9:
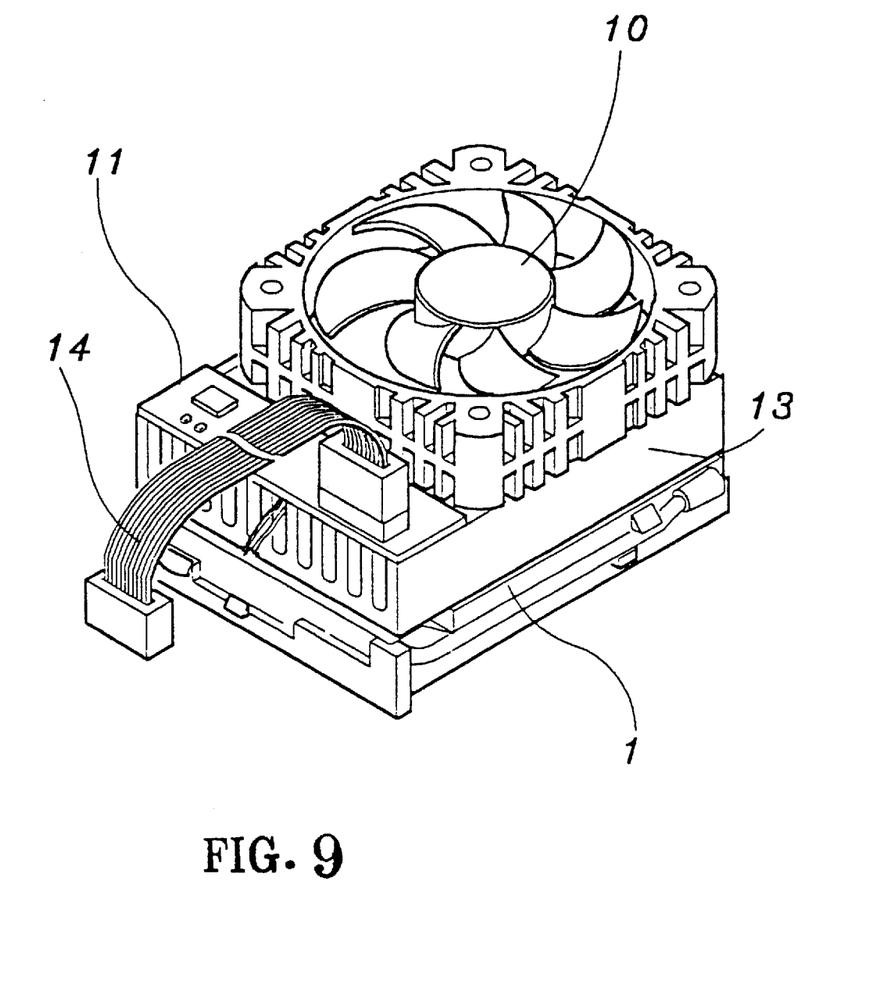
FIG. 9 is a perspective view of the third preferred embodiment.
Figure 10:
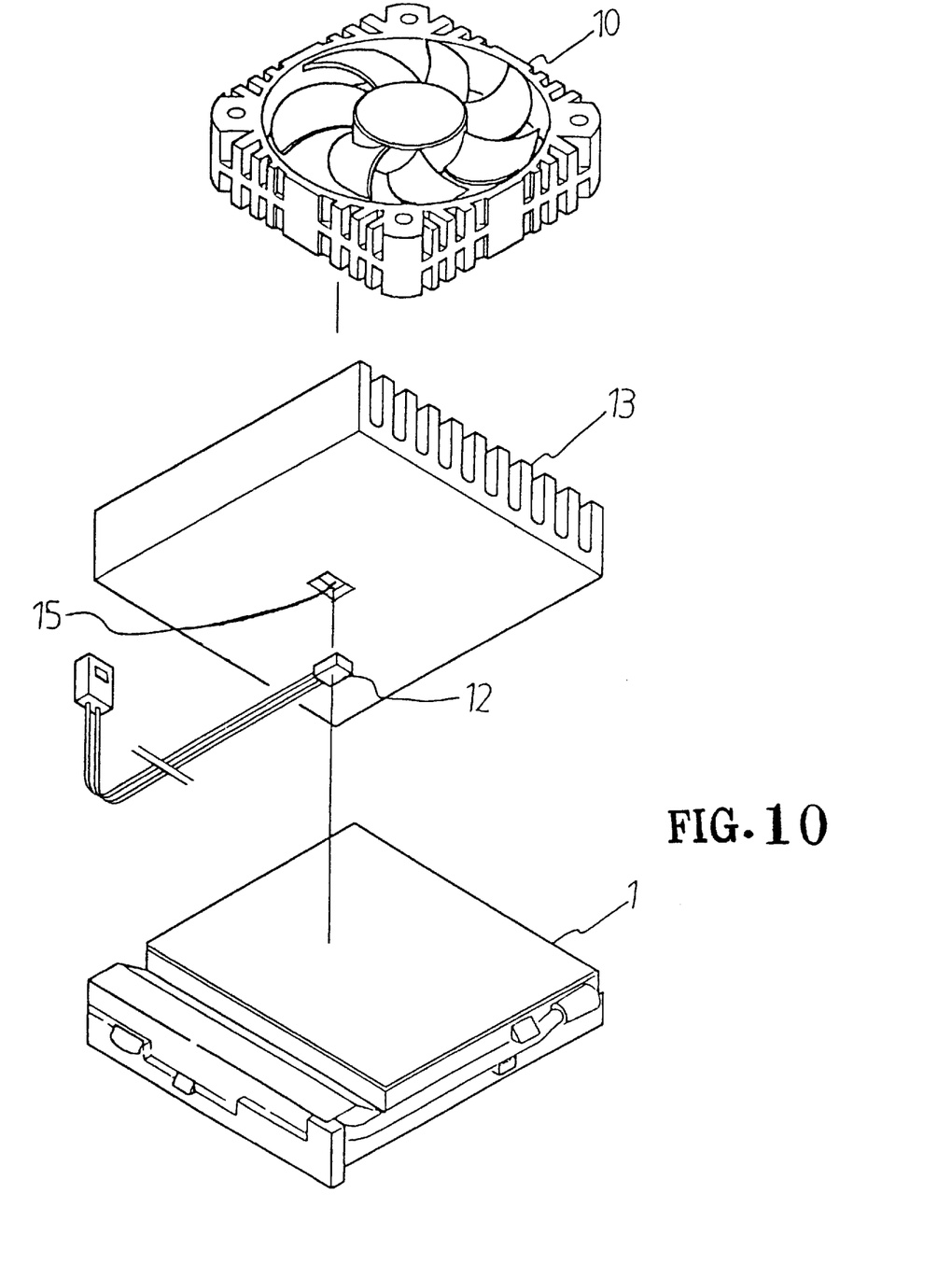
FIG. 10 illustrates a fourth preferred embodiment according to the present invention.

FIGS. 8 and 9 illustrate a third preferred embodiment according to the present invention. As illustrated, the bottom of the heat sink 13 is formed with an elongated groove 15 for receiving the temperature sensor 12. Further, the elongated groove 15 may be replaced with a recess as shown in FIG. 10.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

I claim:

1. A device for cooling microprocessors comprising:

a heat sink provided with a plurality of fins;

a printed circuit board mounted on said heat sink, said printed circuit board being provided with a circuit thereon;

a first fan mounted on said heat sink;

a temperature sensor electrically connected to said circuit; and a 12-pin ribbon cable connecting said printed circuit board to a main board, said ribbon cable having twelve pins whether the first and second ones are used as an input interface between an operator and said printed circuit board, the third one for sending signal to said main board, the fourth one not to be used, the fifth one as an input for a voltage of 5V, the sixth one for sending out signal to cause a loudspeaker to give warning, the seventh one connected to ground, the eighth one for defining reference voltage, the ninth one for driving said fan, the tenth one for an input of a voltage of 3.3V, the eleventh one for detecting rotation of a second fan or inputting a digital signal for controlling said first fan to rotate when temperature of a microprocessor exceeds a preset value and to stop rotating when temperature of the microprocessor is below the preset value, the twelve one for an input of a voltage of 12V;

whereby when temperature of the microprocessor picked up by said temperature sensor exceeds a preset value, said circuit will send signals to the main board, loudspeaker and said first fan via the third, sixth and eleventh pins of said ribbon cable.

2. The device for cooling microprocessors as claimed in claim 1, wherein said printed circuit board is combined to said main board.

3. The device for cooling microprocessors as claimed in claim 1, wherein said temperature sensor is fitted between fins of said heat sink.

4. The device for cooling microprocessors as claimed in claim 1, wherein said heat sink has a bottom formed with a recess dimensioned to receive said temperature sensor.

5. The device for cooling microprocessors as claimed in claim 1, wherein said heat sink has a bottom formed with an elongated groove in which is fitted said temperature sensor.

* * * * *